US011309016B1

(12) United States Patent
Lin et al.

(10) Patent No.: US 11,309,016 B1
(45) Date of Patent: Apr. 19, 2022

(54) VARIABLE-LATENCY DEVICE TO REDUCE SENSE ERROR IN MULTI-LEVEL MULTI-BIT SENSING SCHEME

(71) Applicant: National Chung Cheng University, Chia-Yi (TW)

(72) Inventors: Tay-Jyi Lin, Chiayi County (TW); Yu Chia Hu, Chia-Yi (TW); Yi-Hsuan Ting, Taichung (TW); Jinn-Shyan Wang, Chia-yi (TW)

(73) Assignee: NATIONAL CHUNG CHENG UNIVERSITY, Chia-Yi (TW)

( * ) Notice: Subject to any disclaimer, the term of this patent is extended or adjusted under 35 U.S.C. 154(b) by 0 days.

(21) Appl. No.: 17/152,919

(22) Filed: Jan. 20, 2021

(30) Foreign Application Priority Data

Nov. 26, 2020 (TW) .................................. 109141625

(51) Int. Cl.
| | |
|---|---|
| *G11C 7/12* | (2006.01) |
| *G11C 11/4091* | (2006.01) |
| *G11C 11/408* | (2006.01) |
| *G11C 11/4076* | (2006.01) |
| *G11C 11/4097* | (2006.01) |
| *G11C 11/4094* | (2006.01) |
| *G06F 3/06* | (2006.01) |
| *G06F 7/544* | (2006.01) |
| *G06F 16/22* | (2019.01) |

(52) U.S. Cl.
CPC ........ *G11C 11/4091* (2013.01); *G06F 3/0673* (2013.01); *G06F 7/5443* (2013.01); *G06F 16/2282* (2019.01); *G11C 11/4076* (2013.01); *G11C 11/4085* (2013.01); *G11C 11/4094* (2013.01); *G11C 11/4097* (2013.01)

(58) Field of Classification Search
CPC ............ G11C 11/4091; G11C 11/4076; G11C 11/4085; G11C 11/4094; G11C 11/4097
See application file for complete search history.

(56) References Cited

U.S. PATENT DOCUMENTS

| | | | |
|---|---|---|---|
| 2018/0225116 A1* | 8/2018 | Henry | ....................... G06N 3/04 |
| 2021/0072987 A1* | 3/2021 | Yudanov | ............. G06F 9/30032 |
| 2021/0303265 A1* | 9/2021 | Yudanov | ............... G06F 3/0659 |
| 2021/0357184 A1* | 11/2021 | Lin | ...................... G06F 16/2237 |

\* cited by examiner

*Primary Examiner* — Mushfique Siddique
(74) *Attorney, Agent, or Firm* — Muncy, Geissler, Olds & Lowe, P.C.

(57) ABSTRACT

A variable-latency computing device includes a computing module, enabling units, a storage operation unit, and a detecting controller. The enabling units are divided into at least two groups. The storage operation unit includes word lines and bit lines. The enabling units enable the word line. The storage operation unit accumulates the data values corresponding to the bit lines and the enabled word line, thereby computing first accumulation values. The detecting controller controls the computing module to stop receiving the first accumulation values when the sum of the first accumulation values is higher than a threshold value and takes turns to turn off the at least two groups. The storage operation unit computes second accumulation values during different periods. The computing module receives and computes the second accumulation values corresponding to the at least two groups, so as to generate a computation value.

12 Claims, 9 Drawing Sheets

VARIABLE-LATENCY DEVICE TO REDUCE SENSE ERROR IN MULTI-LEVEL MULTI-BIT SENSING SCHEME

BACKGROUND OF THE INVENTION

This application claims priority of Application No. 109141625 filed in Taiwan on 26 Nov. 2020 under 35 U.S.C. § 119; the entire contents of all of which are hereby incorporated by reference.

FIELD OF THE INVENTION

The present invention relates to a computing device, particularly to a variable-latency computing device.

DESCRIPTION OF THE RELATED ART

Figure 1:
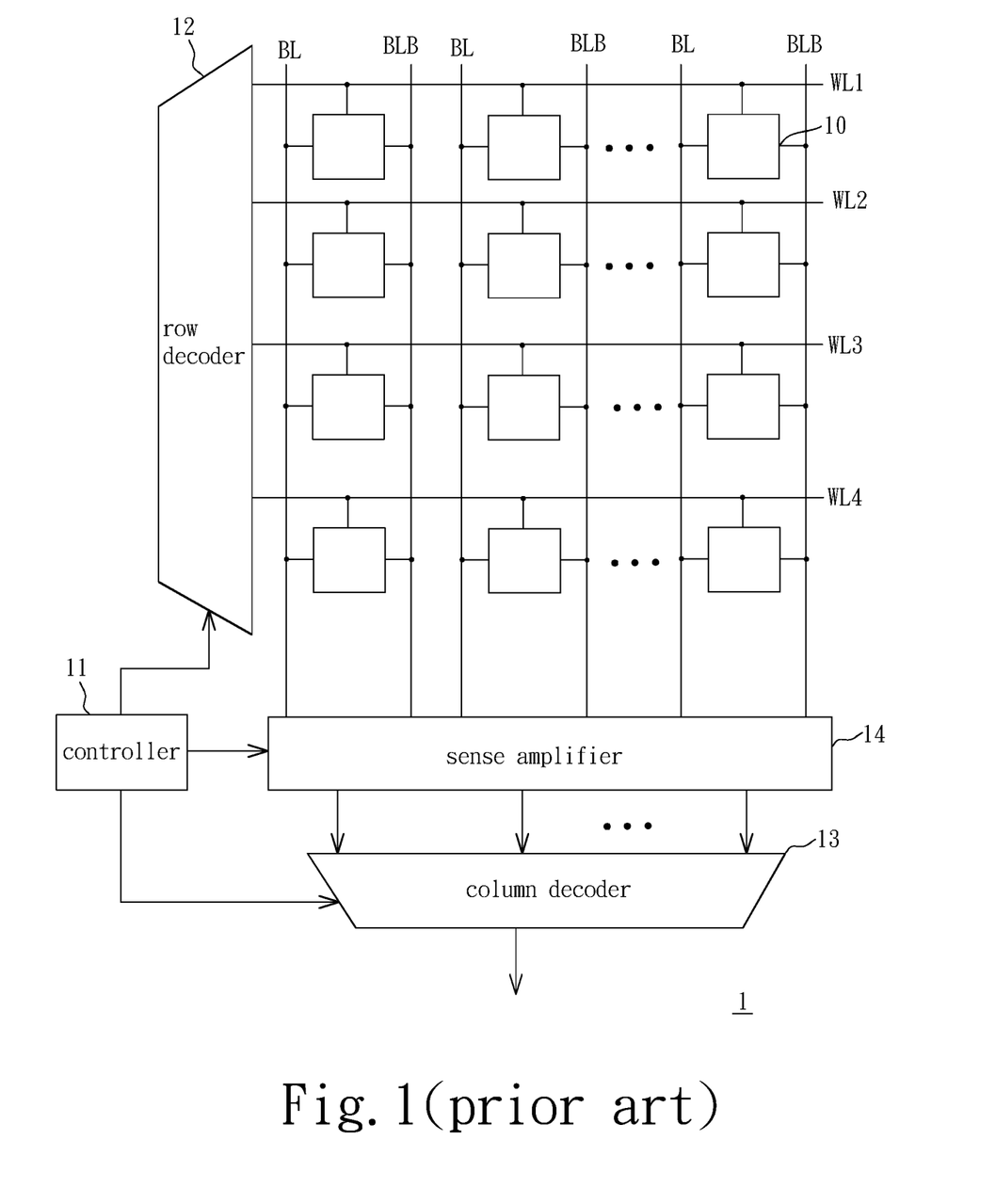
FIG. 1 is a schematic diagram illustrating a double-ended read memory device in the conventional technology.

Nowadays, the computing in memory (CIM) technology applies pulse width modulation (PWM) signals to word lines to activate the word lines and vary the voltages of bit lines. The sensing amplifiers perform multi-level multi-bit sensing on the bit lines to determine the representative values of different voltages and perform CIM on the values, such as addition, multiplication, or inner product computation. FIG. 1 is a schematic diagram illustrating a double-ended read memory device in the conventional technology. As illustrated in FIG. 1, the memory device 1 includes memory cells 10, a controller 11, a row decoder 12, a column decoder 13, and a sense amplifier 14. Each memory cell 10 is coupled to bit lines BL and BLB. Each memory cell 10 is coupled to word lines WL1, WL2, WL3, or WL4. The sense amplifier 14 senses the value in each memory cell 10.

Figure 2:
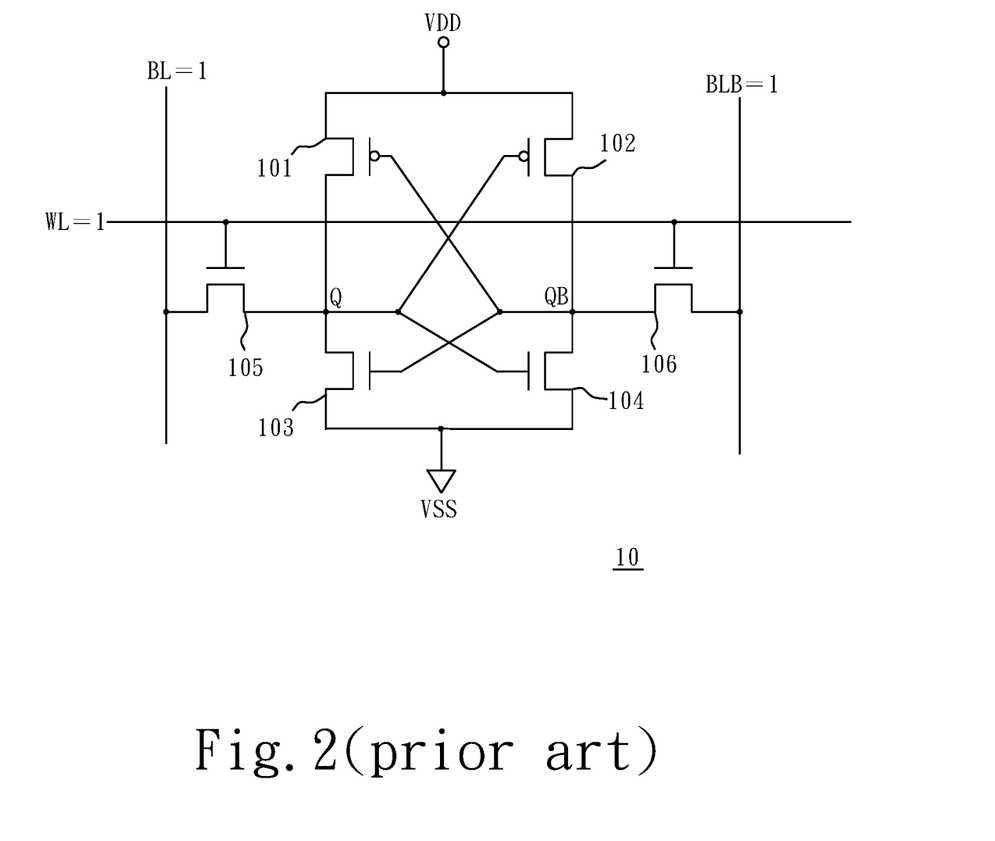
FIG. 2 is a schematic diagram illustrating a memory cell of FIG. 1.
Figure 3:
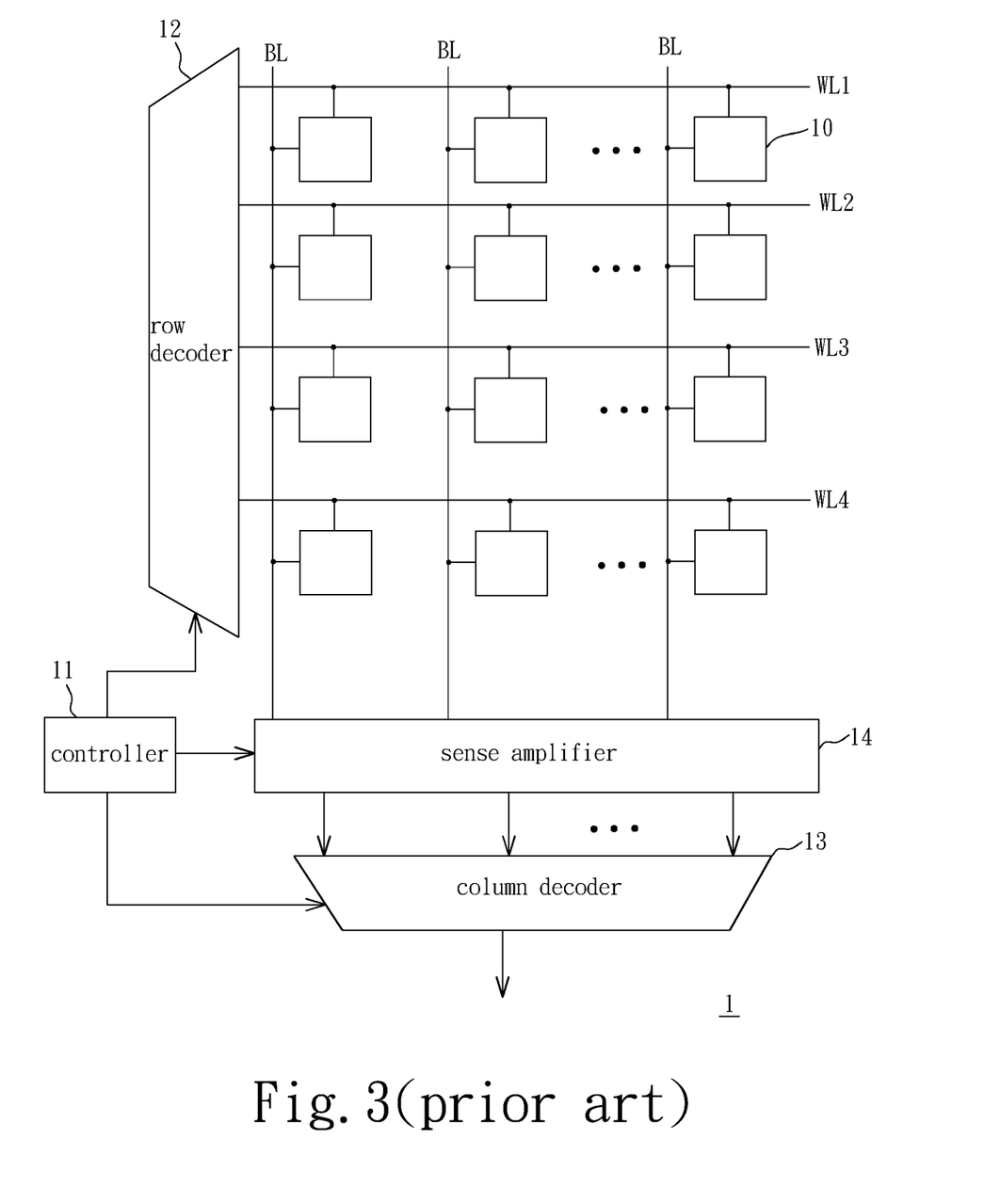
FIG. 3 is a schematic diagram illustrating a single-ended read memory device in the conventional technology.

FIG. 2 is a schematic diagram illustrating a memory cell of FIG. 1. As illustrated in FIG. 2, the memory cell 10 includes two nodes Q and QB, four switching transistors 101, 102, 103, and 104, and two transmitting transistors 105 and 106. The switching transistors 101 and 102 receive a high voltage VDD. The switching transistors 103 and 104 receive a low voltage VSS. When a user reads the number of logic "1" or logic "0" in the memory cells 10, the voltages of the word line WL and the bit lines BL and BLB are asserted logic high. Then, the memory cell 10 changes the voltages of the bit lines BL and BLB according to the voltages of the nodes Q and QB, thereby determining that the stored data include logic "1" or logic "0". The voltages of the nodes Q and QB are respectively a high voltage or a low voltage when the memory cell 10 stores logic "1". When the memory cell 10 reads data, the voltages of the bit lines BL and BLB are respectively a high voltage and a low voltage. The voltages of the nodes Q and QB are respectively a low voltage or a high voltage when the memory cell 10 stores logic "0". When the memory cell 10 reads data, the voltages of the bit lines BL and BLB are respectively a low voltage and a high voltage. Besides, FIG. 1 is also simplified into FIG. 3. FIG. 3 is a schematic diagram illustrating a single-ended read memory device in the conventional technology. The voltage of the bit line BLB is varied as the value stored in the memory cell 10 is varied. The sense amplifier amplifies the minor voltage variation to form different levels, thereby determining the number of the memory cells 10 storing logic "1".

Figure 4:
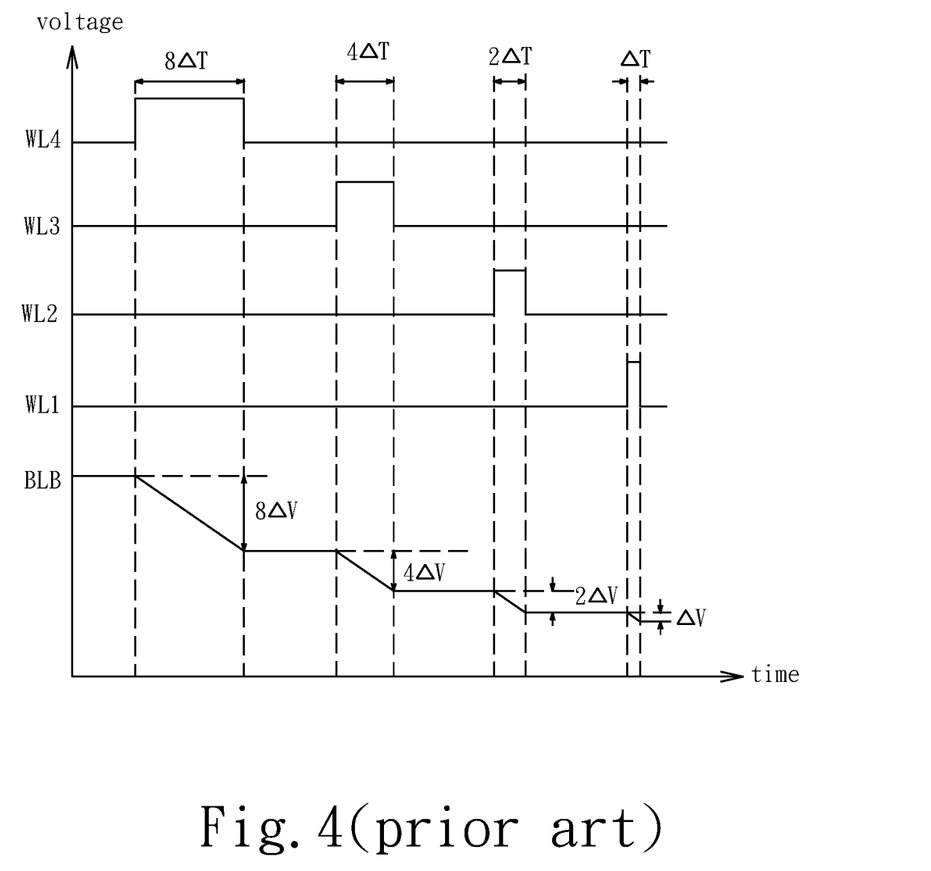
FIG. 4 is a schematic diagram illustrating the voltage waveforms of a bit line and word lines in the conventional technology.

FIG. 4 is a schematic diagram illustrating the voltage waveforms of a bit line and word lines in the conventional technology. As illustrated in FIG. 1 and FIG. 4, the multi-level multi-bit sensing technology not only senses the number of the memory cells 10 storing logic "1", but also forms different levels according to the inputted signal widths. This is the pulse width modulation technology that converts an analog signal into a digital signal. The bit line BLB has a voltage variation of $\Delta V$ when the signal width of the word line WL1 is $\Delta T$. The bit line BLB has a voltage variation of $2\Delta V$ when the signal width of the word line WL2 is $2\Delta T$. The bit line BLB has a voltage variation of $4\Delta V$ when the signal width of the word line WL3 is $4\Delta T$. The bit line BLB has a voltage variation of $8\Delta V$ when the signal width of the word line WL4 is $8\Delta T$. When a single memory cell of a flash memory accesses multiple bits, the bits can be accessed by the multi-level multi-bit sensing technology. In a word, the multi-level multi-bit sensing technology obtains output values with different levels based on different electric variations, such as voltage variations, variations of signal widths, or current variations.

Figure 5:
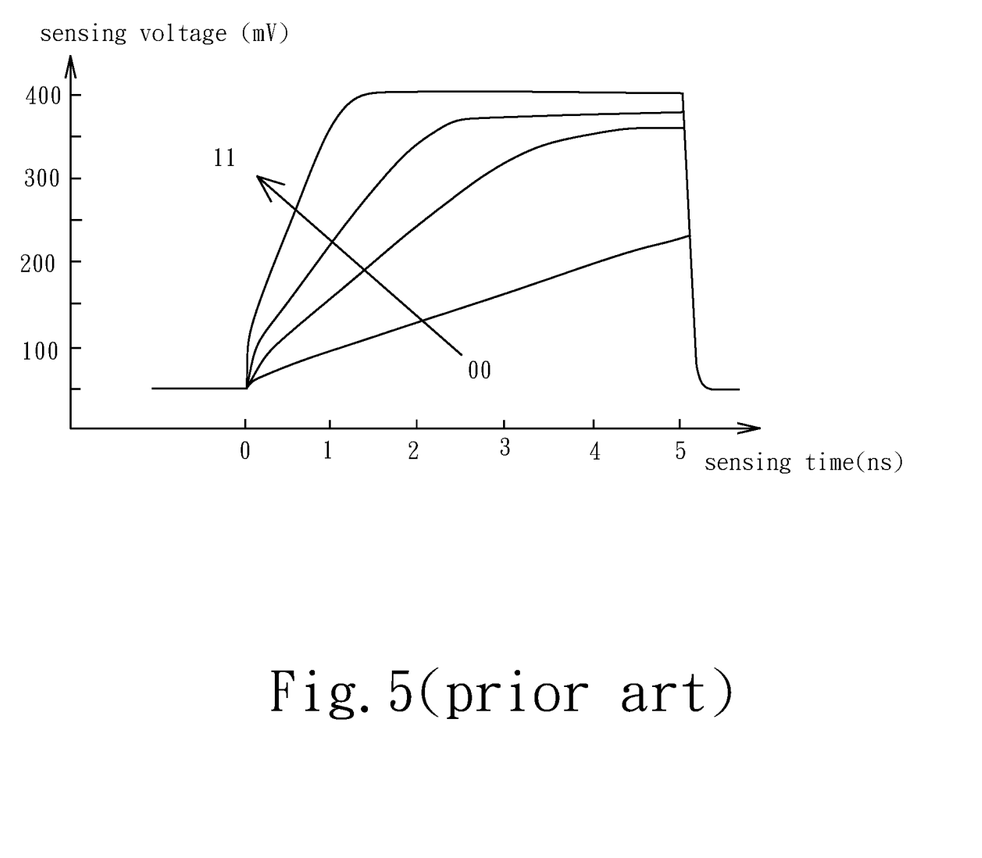
FIG. 5 is a schematic diagram illustrating the curves of the sensing voltage and sensing time of a memory cell in the conventional technology.

However, the levels of the multi-level multi-bit sensing technology are not linear to electric variations. As a result, when the high-level sensing of the multi-level multi-bit sensing technology is performed, the sense amplifier 14 difficultly senses a representative value corresponding to an electric variation. As mentioned above, the sense amplifier 14 senses the voltage variation of the bit line BLB to determine the representative values of different voltages. However, regardless of whether voltage or current is used to sense the voltage variation of the bit line BLB, the number of logic "1" stored in the memory cells 10 or the signal width is not linear to the voltage variation. FIG. 5 is a schematic diagram illustrating the curves of the sensing voltage and sensing time of a memory cell in the conventional technology. When the data stored in the memory cell is larger, the required sensing voltage is higher and the sensing time is shorter. Accordingly, when the sensed value is too large, the time when the sense amplifier senses the value is shorter. As a result, it is more difficult to perform the sensing activity.

In order to solve the above problems, the most straightforward method is to limit the number of word lines that are activated, the inputted signal width, and the number of representative bits stored in each memory cell in one reading activity, thereby limiting the voltage variations of the bit lines. Alternatively, a higher-precision sensing amplifier is used to avoid high-level sensing problems. However, in practical applications, the high-level sensing technology may have few opportunity of sensing data. If the worst case design is used to change the overall architecture for the worst case that seldom occurs, the return on investment will be lower.

To overcome the abovementioned problems, the present invention provides a variable-latency computing device, so as to solve the afore-mentioned problems of the prior art.

SUMMARY OF THE INVENTION

The present invention provides a variable-latency computing device, which has the low complexity and the high precision without increasing additional delay in a typical case.

In an embodiment of the present invention, a variable-latency computing device is provided. The variable-latency computing device includes a computing module, a plurality of enabling units, a storage operation unit, and a detecting controller. The plurality of enabling units is divided into at least two groups. The storage operation unit includes memory cells, word lines arranged in parallel, and bit lines arranged in parallel. The word lines are respectively coupled to the plurality of enabling units. Each of the word lines is coupled to the bit lines through the memory cells. The storage operation unit is coupled to the computing module. The memory cells are configured to respectively store data values. The plurality of enabling units is configured to enable the word line. The storage operation unit is configured to accumulate the data values corresponding to the bit lines and the enabled word line, thereby computing first accumulation values that respectively correspond to the bit lines. The detecting controller is coupled to the storage operation unit, the computing module, and the plurality of enabling units. The detecting controller is configured to receive the first accumulation values. The detecting controller controls the computing module to stop receiving the first accumulation values when the sum of the first accumulation values is higher than a threshold value. The detecting controller takes turns to turn off the at least two groups after the computing module stops receiving the first accumulation values. When each of the at least two groups enables the word line, the storage operation unit accumulates the data values corresponding to the bit lines and the word line that is enabled by each of the at least two groups, thereby computing second accumulation values that respectively correspond to the bit lines. The computing module receives and computes the second accumulation values corresponding to the at least two groups, so as to generate a computation value.

In an embodiment of the present invention, the storage operation unit further includes a plurality of sensing amplifiers. The plurality of sensing amplifiers are respectively coupled to the bit lines and coupled to the detecting controller and the computing module. When the plurality of enabling units enables the word line, the plurality of sensing amplifiers amplifies electric variations of the bit lines to accumulate the data values corresponding to the bit lines and the enabled word line, thereby computing the first accumulation values. The plurality of sensing amplifiers transmits the first accumulation values to the detecting controller. When each of the at least two groups enables the word line, the plurality of sensing amplifiers amplifies electric variations of the bit lines to accumulate the data values corresponding to the bit lines and the word line that is enabled by each of the at least two groups, thereby computing the second accumulation values. The plurality of sensing amplifiers transmits the second accumulation values to the computing module.

In an embodiment of the present invention, the at least two groups comprises a first group and a second group. The detecting controller is configured to receive the second accumulation values corresponding to the first group. When the sum of the second accumulation values corresponding to the first group is higher than the threshold value, the detecting controller controls the computing module to stop receiving the second accumulation values corresponding to the first group. The first group is divided into at least two subgroups. After the computing module stops receiving the second accumulation values corresponding to the first group, the detecting controller takes turns to turn off the at least two subgroups. When each of the at least two subgroups enables the word line, the storage operation unit accumulates the data values corresponding to the bit lines and the word line that is enabled by each of the at least two subgroups, thereby computing third accumulation values that respectively correspond to the bit lines. The computing module receives the third accumulation values corresponding to the at least two subgroups and computes the third accumulation values corresponding to the at least two subgroups and the second accumulation values corresponding to the second group to generate the computation value.

In an embodiment of the present invention, the word lines corresponding to the at least two subgroups are alternately arranged.

In an embodiment of the present invention, the detecting controller controls the computing module to receive the second accumulation values corresponding to the first group when the sum of the second accumulation values corresponding to the first group is less than or equal to the threshold value.

In an embodiment of the present invention, the computing module includes a first redundant to 2's complement (RTC) converter and an accumulation module. The first RTC converter is coupled to the detecting controller and the storage operation unit. The detecting controller is configured to control the first redundant to 2's complement converter to stop receiving the first accumulation values. The first redundant to 2's complement converter is configured to receive, shift, and add the second accumulation values, so as to convert the second accumulation values into a total data value in 2's complement format. The accumulation module is coupled to the first redundant to 2's complement converter and configured to receive and accumulate the total data values corresponding to the at least two groups, so as to generate the computation value.

In an embodiment of the present invention, the variable-latency computing device further includes a second redundant to 2's complement (RTC) converter coupled to the accumulation module and configured to receive the computation value and convert the computation value into a data value in 2's complement format.

In an embodiment of the present invention, the detecting controller controls the computation module to receive the first accumulation values when the sum of the first accumulation values is higher than the threshold value is less than or equal to the threshold value. The computation module computes the first accumulation values to generate the computation value.

In an embodiment of the present invention, the word lines corresponding to the at least two groups are arranged alternately.

In an embodiment of the present invention, the storage operation unit is a computing-in-memory architecture.

In an embodiment of the present invention, the data value comprises logic "1" or logic "0".

In an embodiment of the present invention, each of the first accumulation values or each of the second accumulation values generated by the storage operation unit is the total number of the corresponding logic "1".

To sum up, without limiting the number of word lines that are activated, the inputted signal width, and the number of representative bits stored in each memory cell in one reading activity, the variable-latency computing device optimizes few data whose number is larger than a threshold value based on the probability of occurrence of data. Accordingly, the variable-latency computing device has the low complexity and the high precision without increasing additional delay in a typical case.

Below, the embodiments are described in detail in cooperation with the drawings to make easily understood the technical contents, characteristics and accomplishments of the present invention.

DETAILED DESCRIPTION OF THE INVENTION

Reference will now be made in detail to embodiments illustrated in the accompanying drawings. Wherever possible, the same reference numbers are used in the drawings and the description to refer to the same or like parts. In the drawings, the shape and thickness may be exaggerated for clarity and convenience. This description will be directed in particular to elements forming part of, or cooperating more directly with, methods and apparatus in accordance with the present disclosure. It is to be understood that elements not specifically shown or described may take various forms well known to those skilled in the art. Many alternatives and modifications will be apparent to those skilled in the art, once informed by the present disclosure.

Unless otherwise specified, some conditional sentences or words, such as "can", "could", "might", or "may", usually attempt to express that the embodiment in the present invention has, but it can also be interpreted as a feature, element, or step that may not be needed. In other embodiments, these features, elements, or steps may not be required.

Certain terms are used throughout the description and the claims to refer to particular components. One skilled in the art appreciates that a component may be referred to as different names. This disclosure does not intend to distinguish between components that differ in name but not in function. In the description and in the claims, the term "comprise" is used in an open-ended fashion, and thus should be interpreted to mean "include, but not limited to." The phrases "be coupled to," "couples to," and "coupling to" are intended to compass any indirect or direct connection. Accordingly, if this disclosure mentioned that a first device is coupled with a second device, it means that the first device may be directly or indirectly connected to the second device through electrical connections, wireless communications, optical communications, or other signal connections with/without other intermediate devices or connection means.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment.

Figure 6:
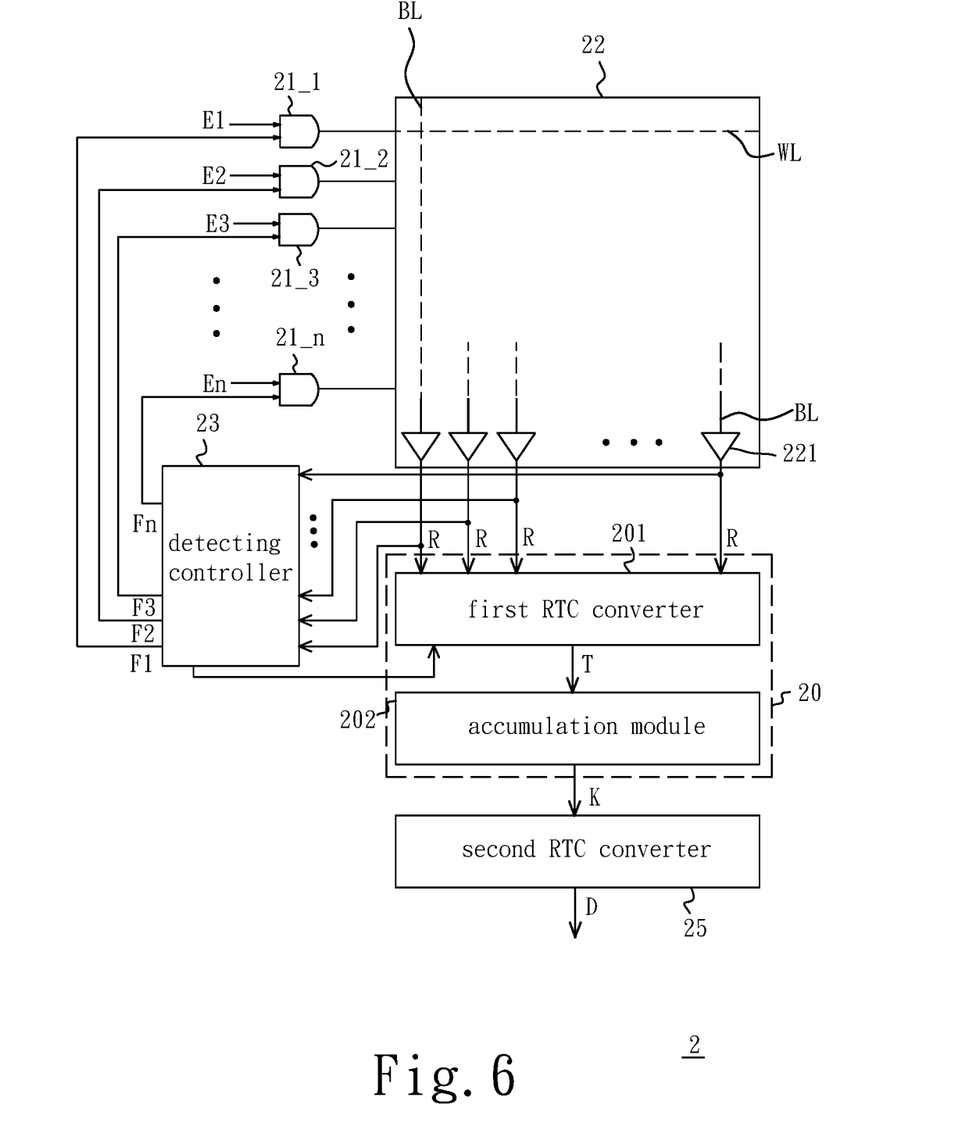
FIG. 6 is a schematic diagram illustrating a variable-latency computing device according to a first embodiment of the present invention.

FIG. 6 is a schematic diagram illustrating a variable-latency computing device according to a first embodiment of the present invention. Referring to FIG. 6, the variable-latency computing device 2 includes a computing module 20, a plurality of enabling units 21_1~21_n, a storage operation unit 22, and a detecting controller 23. The enabling units 21_1~21_n may be implemented with AND gates, but the present invention is not limited thereto. The storage operation unit 22 may be a computing-in-memory architecture. The enabling units 21_1~21_n are divided into at least two groups. Each group includes one or more enabling units according to requirements. The storage operation unit 22 includes memory cells, word lines WL arranged in parallel, and bit lines BL arranged in parallel. The word lines WL are respectively coupled to the plurality of enabling units 21_1~21_n. For example, the word lines WL corresponding to the at least two groups are arranged alternately, but the present invention is not limited thereto. Each of the word lines WL is coupled to the bit lines BL through the memory cells. The storage operation unit 22 may further include a plurality of sensing amplifiers 221. The plurality of sensing amplifiers 221 are respectively coupled to the bit lines BL and coupled to the computing module 20. The memory cells respectively store data values. The data value includes logic "1" or logic "0". The detecting controller 23 is coupled to the plurality of sensing amplifiers 221, the computing module 20, and the plurality of enabling units 21_1~21_n. The plurality of sensing amplifiers 221 is coupled to the detecting controller 23 and the computing module 20.

The operation of the first embodiment of the variable-latency computing device 2 is introduced as follows. When the storage operation unit 22 outputs no signal, the enabling units 21_1~21_n respectively receive first input signals F1~Fn generated by the detecting controller 23. Assume that the first input signals F1~Fn include logic "1". Simultaneously, the enabling units 21_1~21_n respectively receive second input signals E1~En. Assume that the second input signals E1, E2, E3, and E4 include logic "1", and that the remains of the second input signals E1~En include logic "0". As a result, the enabling units 21_1, 21_2, 21_3, and 21_4 respectively corresponding to the second input signals E1, E2, E3, and E4 generate logic "1", and the remains of the enabling units 21_1~21_n generate logic "0". The enabling units 21_1~21_n enable the word lines WL corresponding to the enabling units 21_1, 21_2, 21_3, and 21_4. The sensing amplifiers 221 amplify the electric variations of the bit lines BL to accumulate the data values corresponding to the bit lines BL and the enabled word lines WL, thereby computing first accumulation values R that respectively correspond to the bit lines BL. Then, the sensing amplifiers 221 transmit the first accumulation values R to the detecting controller 23. Each of the first accumulation values R is the total number of the corresponding logic "1".

Figure 7A:
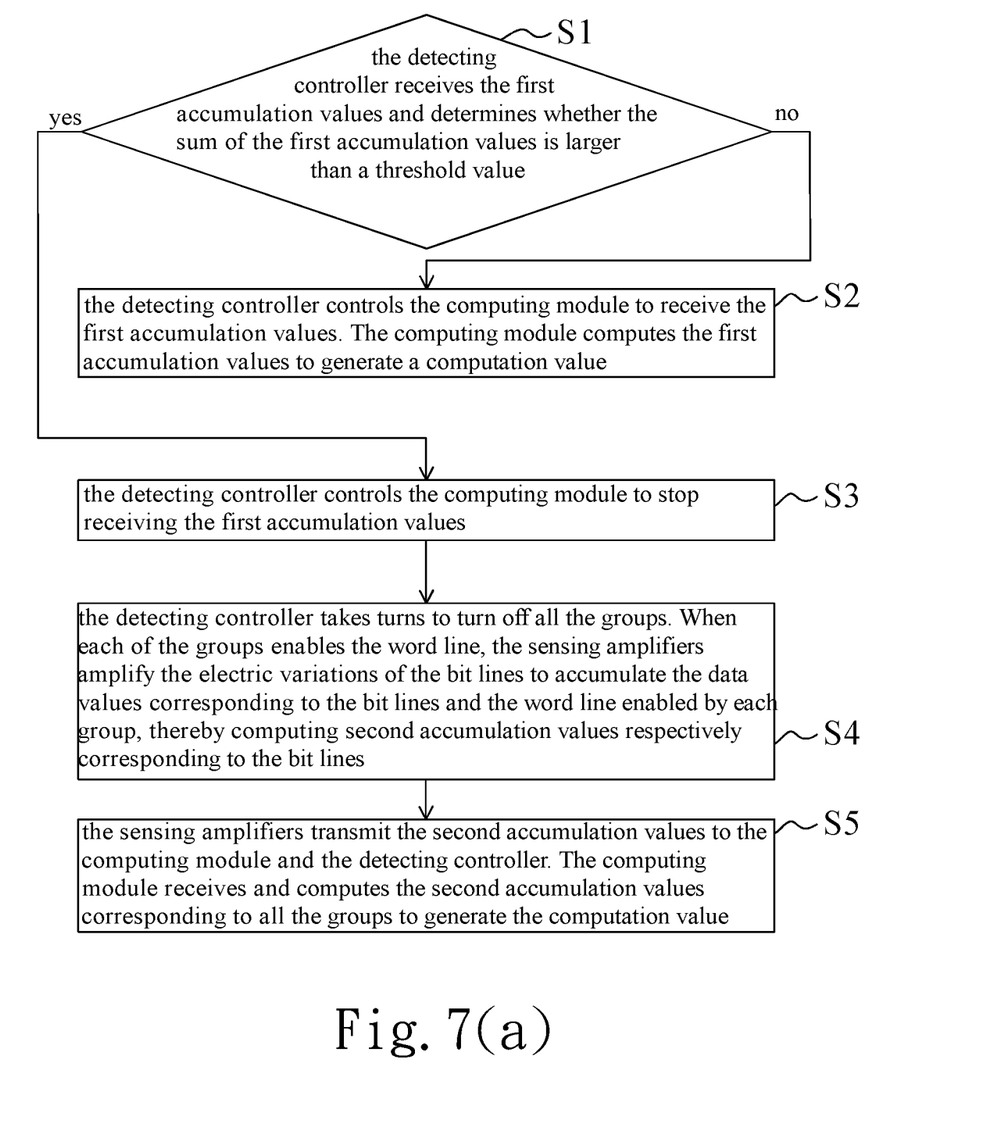
FIG. 7(a) is a flowchart of the operation of a variable-latency computing device according to an embodiment of the present invention.

Refer to FIG. 6 and FIG. 7(a). In Step S1, detecting controller 23 receives the first accumulation values R and determines whether the sum of the first accumulation values R is larger than a threshold value. The sum of the first accumulation values R may be determined by its most significant bit (MSB). When the sum of the first accumulation values R is less than or equal to the threshold value, the detecting controller 23 controls the computing module 20 to receive the first accumulation values R in Step S2. The computing module 20 computes the first accumulation values R to generate a computation value K in Step S2. The detecting controller 23 controls the computing module 20 to stop receiving the first accumulation values R in Step S3 when the sum of the first accumulation values R is higher than the threshold value. For example, the detecting controller 23 may generate and transmit a signal to the computing module 20, such that the computing module 20 stops receiving the first accumulation values R based on the signal. The detecting controller 23 takes turns to turn off all the groups in Step S4 after the computing module 20 stops receiving the first accumulation values R. In the first embodiment, all the groups include a first group and a second group. The word lines WL corresponding to the first group and the second group may be alternately arranged, but the present invention is not limited thereto. In other words, the detecting controller 23 turns on the first group of the enabling units 21_1~21_n and turns off the second group of the enabling units 21_1~21_n. Afterwards, the detecting controller 23 turns off the first group of the enabling units 21_1~21_n and turns on the second group of the enabling units 21_1~21_n. Assume that the first group includes the enabling units 21_1 and 21_3, and that the second group includes the enabling units 21_2 and 21_4. When the detecting controller 23 turns on the enabling units 21_1 and 21_3 and turns off the enabling units 21_2 and 21_4, the first input signals F1 and F3 include logic "1" and the first input signals F2 and F4 include logic "0". When the detecting controller 23 turns off the enabling units 21_1 and 21_3 and turns on the enabling units 21_2 and 21_4, the first input signals F1 and F3 include logic "0" and the first input signals F2 and F4 include logic "1".

In Step S4, when each of the groups enables the word line WL, the sensing amplifiers 221 amplify the electric variations of the bit lines BL to accumulate the data values corresponding to the bit lines and the word line enabled by each group, thereby computing second accumulation values R respectively corresponding to the bit lines BL. Each of the second accumulation values R is the total number of the corresponding logic "1". In Step S5, the sensing amplifiers 221 transmit the second accumulation values R to the computing module 20 and the detecting controller 23. The computing module 20 receives and computes the second accumulation values R corresponding to all the groups to generate the computation value K. Specifically, when the enabling units 21_1 and 21_3 are turned on, the sensing amplifiers 221 amplify the electric variations of the bit lines BL to accumulate the data values corresponding to the bit lines BL and the word lines WL enabled by the enabling units 21_1 and 21_3, thereby computing second accumulation values R respectively corresponding to the bit lines BL. The sensing amplifiers 221 transmit the second accumulation values R corresponding to the enabling units 21_1 and 21_3 to the computing module 20. The computing module 20 receives and computes the second accumulation values R corresponding to the enabling units 21_1 and 21_3, so as to generate a first operation value. Since the computing module 20 includes a register, the computing module 20 can store the first operation value. When the enabling units 21_2 and 21_4 are turned on, the sensing amplifiers 221 amplify the electric variations of the bit lines BL to accumulate the data values corresponding to the bit lines BL and the word lines WL enabled by the enabling units 21_2 and 21_4, thereby computing second accumulation values R respectively corresponding to the bit lines BL. The sensing amplifiers 221 transmit the second accumulation values R corresponding to the enabling units 21_2 and 21_4 to the computing module 20. The computing module 20 receives and computes the second accumulation values R corresponding to the enabling units 21_2 and 21_4, so as to generate a second operation value. The computing module 20 generates the computation value K based on the first operation value and the second operation value.

Figure 7B:
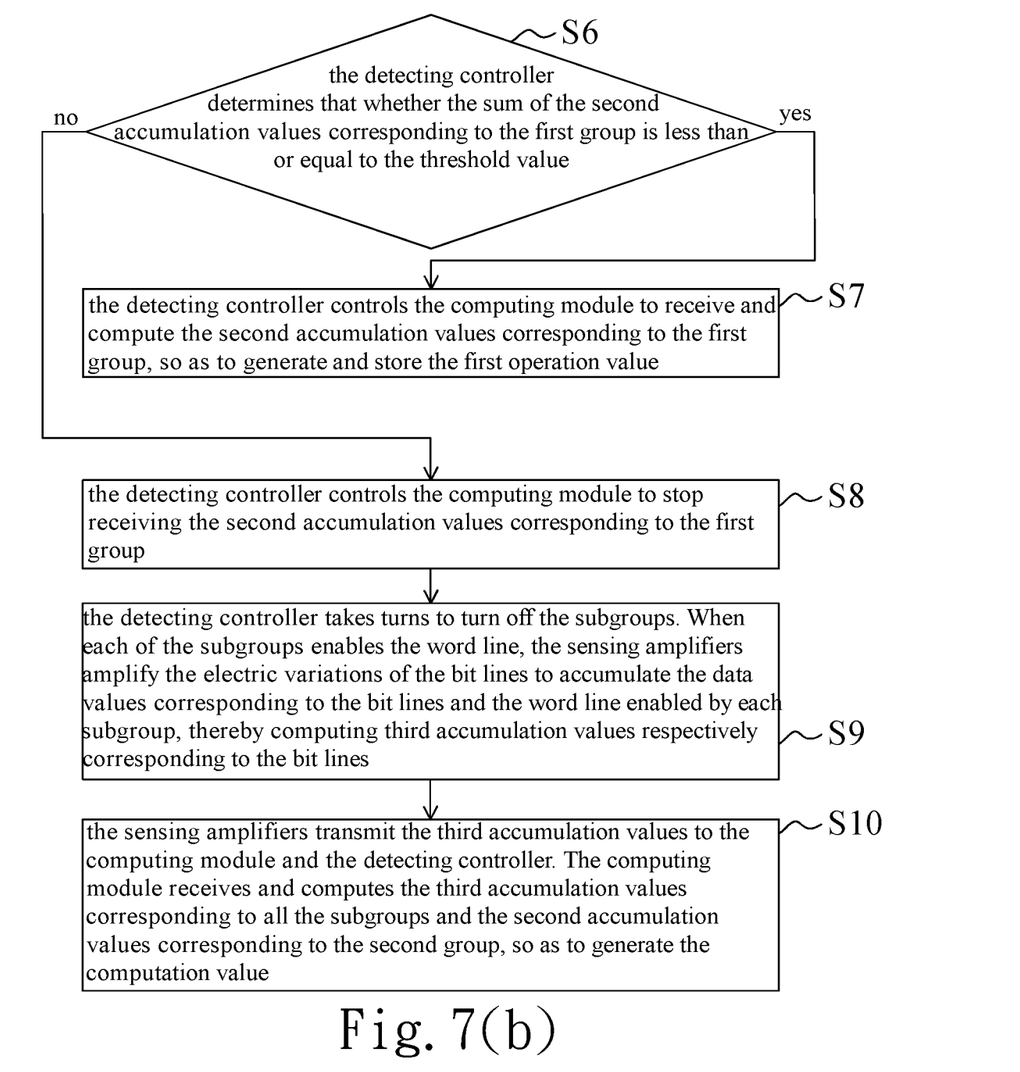
FIG. 7(b) is a flowchart of the operation of a variable-latency computing device according to another embodiment of the present invention.

Refer to FIG. 6 and FIG. 7(b). In Step S6, the detecting controller 23 determines whether the sum of the second accumulation values R corresponding to the first group is less than or equal to the threshold value. If the sum of the second accumulation values R corresponding to the first group is less than or equal to the threshold value, the detecting controller 23 controls the computing module 20 to receive and compute the second accumulation values R corresponding to the first group, so as to generate and store the first operation value in Step S7. The sum of the second accumulation values R is determined by its MSB. When the detecting controller 23 determines that the sum of the second accumulation values R corresponding to the first group is higher than the threshold value, the detecting controller 23 controls the computing module 20 to stop receiving the second accumulation values R corresponding to the first group in Step S8. For example, the detecting controller 23 may generate and transmit a signal to the computing module 20, such that the computing module 20 stops receiving the second accumulation values R based on the signal. In the first embodiment, the first group may be divided into at least two subgroups. The word lines WL corresponding to the subgroups are alternately arranged, but the present invention is not limited thereto. After the computing module 20 stops receiving the second accumulation values R corresponding to the first group, the detecting controller 23 takes turns to turn off the subgroups in Step S9. Assume that a subgroup of the first group includes the enabling unit 21_1, and that another subgroup of the first group includes the enabling unit 21_3. Then, the detecting controller 23 turns on the enabling unit 21_1 and turns off the enabling unit 21_3. Afterwards, the detecting controller 23 turns off the enabling unit 21_1 and turns on the enabling unit 21_3. When the detecting controller 23 turns on the enabling unit 21_1 and turns off the enabling unit 21_3, the first input signal F1 includes logic "1" and the first input signal F3 includes logic "0". When the detecting controller 23 turns off the enabling unit 21_1 and turns on the enabling unit 21_3, the first input signal F1 includes logic "0" and the first input signal F3 includes logic "1".

In Step S9, when each of the subgroups enables the word line WL, the sensing amplifiers 221 amplify the electric variations of the bit lines BL to accumulate the data values corresponding to the bit lines and the word line enabled by each subgroup, thereby computing third accumulation values R respectively corresponding to the bit lines BL. Each of the third accumulation values R is the total number of the corresponding logic "1". In Step S10, the sensing amplifiers 221 transmit the third accumulation values R to the computing module 20 and the detecting controller 23. The computing module 20 receives and computes the third accumulation values R corresponding to all the subgroups and the second accumulation values R corresponding to the second group, so as to generate the computation value K. Specifically, when the enabling unit 21_1 is turned on, the sensing amplifiers 221 amplify the electric variations of the bit lines BL to accumulate the data values corresponding to the bit lines BL and the word lines WL enabled by the enabling unit 21_1, thereby computing third accumulation values R respectively corresponding to the bit lines BL. The sensing amplifiers 221 transmit the third accumulation values R corresponding to the enabling unit 21_1 to the computing module 20 and the detecting controller 23. The computing module 20 receives and computes the third accumulation values R corresponding to the enabling unit 21_1, so as to generate a first sub-operation value. Since the computing module 20 includes a register, the computing module 20 can store the first sub-operation value. When the enabling unit 21_3 is turned on, the sensing amplifiers 221 amplify the electric variations of the bit lines BL to accumulate the data values corresponding to the bit lines BL and the word lines WL enabled by the enabling unit 21_3, thereby computing third accumulation values R respectively corresponding to the bit lines BL. The sensing amplifiers 221 transmit the third accumulation values R corresponding to the enabling units 21_3 to the computing module 20 and the detecting controller 23. The computing module 20 receives and computes the third accumulation values R corresponding to the enabling unit 21_3, so as to generate a second sub-operation value. When the enabling units 21_2 and 21_4 are turned on, the sensing amplifiers 221 amplify the electric variations of the bit lines BL to accumulate the data values corresponding to the bit lines BL and the word lines WL enabled by the enabling units 21_2 and 21_4, thereby computing second accumulation values R respectively corresponding to the bit lines BL. The sensing amplifiers 221 transmit the second accumulation values R corresponding to the enabling units 21_2 and 21_4 to the computing module 20. The computing module 20 receives and computes the second accumulation values R corresponding to the enabling units 21_2 and 21_4, so as to generate a second operation value. The computing module 20 generates the computation value K based on the first sub-operation value, the second sub-operation value, and the second operation value. In addition, when the third accumulation values R are generated, the detecting controller 23 determines whether the sum of the third accumulation values R is larger than the threshold value. When the sum of the third accumulation values R is larger than the threshold value, the detecting controller 23 continues dividing each subgroup and controls the computing module 20 to stop receiving the third accumulation values R. For example, the detecting controller 23 may generate and transmit a signal to the computing module 20, such that the computing module 20 stops receiving the third accumulation values R based on the signal. When the sum of the third accumulation values R is not larger than the threshold value, the first sub-operation value and the second sub-operation value are successfully generated. The sum of the third accumulation values R is determined by its MSB.

As mentioned above, the variable-latency computing device 2 can avoid redundant designs due to very few cases to improve the performance or energy consumption ratio of circuits. Besides, the variable-latency computing device 2 spends extra time and energy sensing patterns that rarely appear many times, thereby obtaining the correct value without reducing the accuracy and obtaining the optimal parameter settings in probability and statistic, such as the average performance and the energy consumption.

In some embodiments of the present invention, the computing module 20 may include a first redundant to 2's complement (RTC) converter 201 and an accumulation module 202. The first RTC converter 201 is coupled to the detecting controller 23 and the sensing amplifiers 221. The accumulation module 202 is coupled to the first RTC converter 201. The detecting controller 23 controls the first RTC converter 201 to stop receiving the first accumulation values R or the second accumulation values R corresponding to the first group. The first RTC converter 201 receives, shifts, and adds the second accumulation values R corresponding to the second group or the third accumulation values R, so as to convert them into a total data value T in 2's complement format. The accumulation module 202 receives and accumulates the total data values T corresponding to all the groups, so as to generate the computation value K. In order to increase the precision of the computation value K, the variable-latency computing device 2 may further include a second redundant to 2's complement (RTC) converter 25 coupled to the accumulation module 202. The second RTC converter 25 receives the computation value K and converts the computation value K into a data value D in 2's complement format.

Figure 8:
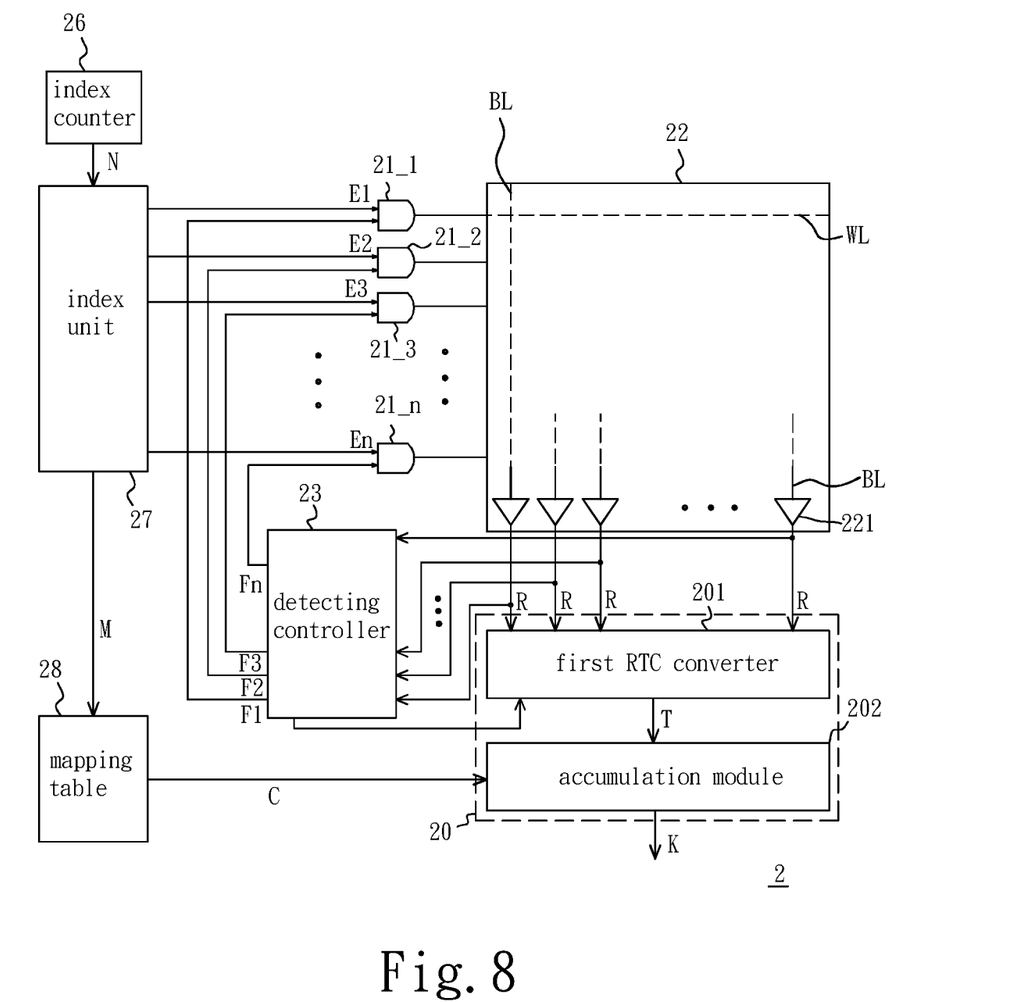
FIG. 8 is a schematic diagram illustrating a variable-latency computing device according to a second embodiment of the present invention.

FIG. 8 is a schematic diagram illustrating a variable-latency computing device according to a second embodiment of the present invention. Referring to FIG. 6 and FIG. 8, the second embodiment is different from the first embodiment in that the second embodiment lacks the second RTC converter 25. Besides, the second embodiment further includes an index counter 26, an index unit 27, and a mapping table 28. The accumulation module 202 is exemplified by a multiplier-accumulate module. The index counter 26 is coupled to the index unit 27. The index unit 27 stores index values corresponding to the word lines WL. The index unit 27 is coupled to the enabling units 21_1~21_n. The mapping table 28 is coupled to the index unit 27 and the accumulation module 202. The mapping table 28 stores coefficients C corresponding to all the index values. The index counter 26 generates a count value N. The index unit 27 receives the count value N and outputs a mapping value M. The mapping value M corresponds to the count value N. Alternatively, the mapping value M is the same to the count value N. Assume that the mapping value M corresponds to the enabling units 21_1, 21_2, 21_3, and 21_4. Thus, the index unit 27 transmits logic "1" to the enabling units 21_1, 21_2, 21_3, and 21_4 corresponding to the mapping value M. The mapping table 28 receives the mapping value M and outputs the coefficient C corresponding to the mapping value M. The accumulation module 202 receives the coefficient C and the total data values T corresponding to all the groups, and multiplies and accumulates each total data value T and the coefficient C based on the distributive law, so as to generate an inner product value as the computation value K.

According to the neural network model, the sensing limit of the sensing amplifier, the training data and the data storing format, the user can calculate the numbers of word lines and bit lines of the storage operation unit and the sensing times for completing the calculation of all data in the storage operation unit, thereby obtaining the required average operation time, as shown in formula 1, where t represents time. According to the abovementioned data, the variable-latency computing device applied to neural networks is obtained.

$$\text{Average operation time} = \text{threshold value} \times \text{additional sensing times } (t) \qquad (1)$$

Assume that the neural network model has a size of 256×256×256×10, the sensing amplifier can sense 99.9998% of data, the threshold value is 0.00002%, the training data are included in the Modified National Institute of Standards and Technology database, the data storing format is a single-precision floating-point format. According to these data, it is known that the number of the word lines is 256 and the number of the bit lines is 32, If the neural network computes the training data, 0.00002% of the total number of the sensing values is larger than or equal to 64. As a result, when the total number of the sensed logic "1." is higher than the threshold value, four additional activities are needed to obtain a value with high precision. Average operation time=1+0.00002%×4=1.00008% seconds.

According to the embodiments provided above, without limiting the number of word lines that are activated, the inputted signal width, and the number of representative bits stored in each memory cell in one reading activity, the variable-latency computing device optimizes few data whose number is larger than a threshold value based on the probability of occurrence of data. Accordingly, the variable-latency computing device has the low complexity and the high precision without increasing additional delay in a typical case.

The embodiments described above are only to exemplify the present invention but not to limit the scope of the present invention. Therefore, any equivalent modification or variation according to the shapes, structures, features, or spirit disclosed by the present invention is to be also included within the scope of the present invention.

What is claimed is:

1. A variable-latency computing device comprising:
    a computing module;
    a plurality of enabling units divided into at least two groups;
    a storage operation unit comprising memory cells, word lines arranged in parallel, and bit lines arranged in parallel, wherein the word lines are respectively coupled to the plurality of enabling units, each of the word lines is coupled to the bit lines through the memory cells, the storage operation unit is coupled to the computing module, the memory cells are configured to respectively store data values, the plurality of enabling units are configured to enable the word line, and the storage operation unit is configured to accumulate the data values corresponding to the bit lines and the enabled word line, thereby computing first accumulation values that respectively correspond to the bit lines; and
    a detecting controller coupled to the storage operation unit, the computing module, and the plurality of enabling units, wherein the detecting controller is configured to receive the first accumulation values, the detecting controller controls the computing module to stop receiving the first accumulation values when a sum of the first accumulation values is higher than a threshold value, and the detecting controller takes turns to turn off the at least two groups after the computing module stops receiving the first accumulation values;
    wherein when each of the at least two groups enables the word line, the storage operation unit accumulates the data values corresponding to the bit lines and the word line that is enabled by each of the at least two groups, thereby computing second accumulation values that respectively correspond to the bit lines, and the computing module receives and computes the second accumulation values corresponding to the at least two groups, so as to generate a computation value.

2. The variable-latency computing device according to claim 1, wherein the storage operation unit further comprises a plurality of sensing amplifiers, and the plurality of sensing amplifiers are respectively coupled to the bit lines and coupled to the detecting controller and the computing module; when the plurality of enabling units enables the word line, the plurality of sensing amplifiers amplifies electric variations of the bit lines to accumulate the data values corresponding to the bit lines and the enabled word line, thereby computing the first accumulation values, and the plurality of sensing amplifiers transmits the first accumulation values to the detecting controller; and when each of the at least two groups enables the word line, the plurality of sensing amplifiers amplifies electric variations of the bit lines to accumulate the data values corresponding to the bit lines and the word line that is enabled by each of the at least two groups, thereby computing the second accumulation values, and the plurality of sensing amplifiers transmits the second accumulation values to the computing module.

3. The variable-latency computing device according to claim 1, wherein the at least two groups comprises a first group and a second group, the detecting controller is configured to receive the second accumulation values corresponding to the first group; when a sum of the second accumulation values corresponding to the first group is higher than the threshold value, the detecting controller controls the computing module to stop receiving the second accumulation values corresponding to the first group; the first group is divided into at least two subgroups; after the computing module stops receiving the second accumulation values corresponding to the first group, the detecting controller takes turns to turn off the at least two subgroups; when each of the at least two subgroups enables the word line, the storage operation unit accumulates the data values corresponding to the bit lines and the word line that is enabled by each of the at least two subgroups, thereby computing third accumulation values that respectively correspond to the bit lines; and the computing module receives the third accumulation values corresponding to the at least two subgroups and computes the third accumulation values corresponding to the at least two subgroups and the second accumulation values corresponding to the second group to generate the computation value.

4. The variable-latency computing device according to claim 3, wherein the word lines corresponding to the at least two subgroups are alternately arranged.

5. The variable-latency computing device according to claim 3, wherein the detecting controller controls the computing module to receive the second accumulation values corresponding to the first group when a sum of the second accumulation values corresponding to the first group is less than or equal to the threshold value.

6. The variable-latency computing device according to claim 1, wherein the computing module includes:
    a first redundant to 2's complement (RTC) converter coupled to the detecting controller and the storage operation unit, wherein the detecting controller is configured to control the first redundant to 2's complement converter to stop receiving the first accumulation values, and the first redundant to 2's complement converter is configured to receive, shift, and add the second accumulation values, so as to convert the second accumulation values into a total data value in 2's complement format; and
    an accumulation module coupled to the first redundant to 2's complement converter and configured to receive and accumulate the total data values corresponding to the at least two groups, so as to generate the computation value.

7. The variable-latency computing device according to claim 6, further comprising a second redundant to 2's complement (RTC) converter coupled to the accumulation module and configured to receive the computation value and convert the computation value into a data value in 2's complement format.

8. The variable-latency computing device according to claim 1, wherein the detecting controller controls the computation module to receive the first accumulation values when a sum of the first accumulation values is higher than the threshold value is less than or equal to the threshold value, and the computation module computes the first accumulation values to generate the computation value.

9. The variable-latency computing device according to claim 1, wherein the word lines corresponding to the at least two groups are arranged alternately.

10. The variable-latency computing device according to claim 1, wherein the storage operation unit is a computing-in-memory architecture.

11. The variable-latency computing device according to claim 1, wherein the data value comprises logic "1" or logic "0".

12. The variable-latency computing device according to claim 11, wherein each of the first accumulation values or each of the second accumulation values generated by the storage operation unit is total number of the corresponding logic "1".

* * * * *